US006975509B2

(12) United States Patent
Osborn et al.

(10) Patent No.: US 6,975,509 B2
(45) Date of Patent: Dec. 13, 2005

(54) COMPUTING APPARATUS WITH COOLING FAN

(75) Inventors: Jay K. Osborn, Crowthorne (GB); Helenaur Wilson, Frogmore (GB)

(73) Assignee: Sun Microsystems, Inc., Santa Clara, CA (US)

( * ) Notice: Subject to any disclaimer, the term of this patent is extended or adjusted under 35 U.S.C. 154(b) by 211 days.

(21) Appl. No.: 10/146,849

(22) Filed: May 16, 2002

(65) Prior Publication Data

US 2003/0214782 A1 Nov. 20, 2003

(51) Int. Cl.$^7$ .................................................. G06F 1/20
(52) U.S. Cl. ...................... 361/687; 361/697; 165/80.2
(58) Field of Search .............................. 361/687–697, 361/714–722; 165/80.2–80.3, 121

(56) References Cited

U.S. PATENT DOCUMENTS

| | | |
|---|---|---|
| 4,401,351 A | 8/1983 | Record |
| 4,479,198 A | 10/1984 | Romano et al. |
| 4,502,099 A | 2/1985 | Manes et al. |
| 4,558,914 A | 12/1985 | Prager et al. |
| 4,739,445 A | 4/1988 | Tragen |
| 4,797,783 A | 1/1989 | Kohmoto et al. |
| 4,935,845 A | 6/1990 | Schwehr et al. |
| 5,124,885 A | 6/1992 | Liu |
| 5,208,722 A | 5/1993 | Ryan et al. |
| 5,260,851 A | 11/1993 | Chiou |
| 5,309,323 A | 5/1994 | Gray et al. |
| 5,398,159 A | 3/1995 | Andersson et al. |
| 5,419,629 A | 5/1995 | Korinsky |
| 5,424,914 A | 6/1995 | Smith et al. |
| 5,506,750 A | 4/1996 | Carteau et al. |
| 5,587,881 A | 12/1996 | Wang |
| 5,612,854 A | 3/1997 | Wiscombe et al. |
| 5,625,535 A | 4/1997 | Hulsebosch et al. |

(Continued)

FOREIGN PATENT DOCUMENTS

JP      2000149541      5/2000

*Primary Examiner*—Yean-Hsi Chang
(74) *Attorney, Agent, or Firm*—Meyertons Hood Kivlin Kowert & Goetzel, P.C.; B. Noël Kivlin

(57) ABSTRACT

Computing apparatus including a housing that defines a cavity. The computer apparatus further includes within the cavity multiple computing components, such as a processor, memory, and so on, and a fan for generating an airflow to cool these components. There is a first path defining an air inflow for the fan, and a second path defining an air outflow for the fan. One of these paths is externally ducted to a vent facility in a first wall of the housing, and the other one of the paths communicates with the cavity adjacent the first wall. Typically, the externally ducted airflow is arranged to cool a CPU, which is the component most vulnerable to overheating.

43 Claims, 6 Drawing Sheets

U.S. PATENT DOCUMENTS

| | | | |
|---|---|---|---|
| 5,761,045 A | 6/1998 | Olson et al. | |
| 5,767,999 A | 6/1998 | Kayner | |
| 5,772,500 A | 6/1998 | Harvey et al. | |
| 5,774,343 A | 6/1998 | Benson et al. | |
| 5,777,848 A | 7/1998 | McAnally et al. | |
| 5,781,408 A | 7/1998 | Crane et al. | |
| 5,796,580 A | 8/1998 | Komatsu et al. | |
| 5,813,243 A | 9/1998 | Johnson et al. | |
| 5,816,673 A | 10/1998 | Sauer et al. | |
| 5,822,184 A | 10/1998 | Rabinovitz | |
| 5,828,549 A | 10/1998 | Gandre et al. | |
| 5,936,836 A | 8/1999 | Scholder | |
| 5,963,424 A | 10/1999 | Hileman | |
| 5,999,365 A | 12/1999 | Hasegawa et al. | |
| 6,011,689 A * | 1/2000 | Wrycraft | 361/695 |
| 6,018,456 A | 1/2000 | Young et al. | |
| 6,031,720 A | 2/2000 | Crane | |
| 6,034,870 A | 3/2000 | Osborn et al. | |
| 6,052,281 A | 4/2000 | Hardt et al. | |
| 6,052,282 A | 4/2000 | Sugiyama et al. | |
| 6,058,011 A | 5/2000 | Hardt et al. | |
| 6,061,244 A | 5/2000 | OSullivan et al. | |
| 6,094,346 A * | 7/2000 | Schweers et al. | 361/695 |
| D431,810 S | 10/2000 | Weng | |
| 6,144,553 A | 11/2000 | Hileman et al. | |
| 6,169,656 B1 | 1/2001 | Pei | |
| 6,236,565 B1 | 5/2001 | Gordon | |
| 6,244,953 B1 | 6/2001 | Dugan | |
| 6,247,078 B1 | 6/2001 | Ebert et al. | |
| 6,272,016 B1 | 8/2001 | Matonis et al. | |
| 6,278,608 B1 | 8/2001 | Ater et al. | |
| 6,285,546 B1 | 9/2001 | Watarai et al. | |
| 6,364,009 B1 | 4/2002 | MacManus | |
| D460,042 S | 7/2002 | Rodriguez | |
| 6,452,797 B1 | 9/2002 | Konstad | |
| 6,459,589 B2 | 10/2002 | Manweiler et al. | |
| 6,496,366 B1 | 12/2002 | Coglitore et al. | |
| 6,556,438 B1 | 4/2003 | Bolognia et al. | |
| 6,594,150 B2 | 7/2003 | Creason et al. | |
| 6,650,536 B2 * | 11/2003 | Lee et al. | 361/687 |
| 6,678,157 B1 | 1/2004 | Bestwick | |
| 2003/0002254 A1 * | 1/2003 | Faneuf et al. | |
| 2003/0030975 A1 | 2/2003 | Bestwick et al. | |
| 2003/0030976 A1 | 2/2003 | Garnett et al. | |
| 2003/0030978 A1 | 2/2003 | Garnett et al. | |
| 2003/0156385 A1 * | 8/2003 | Askeland et al. | |

* cited by examiner

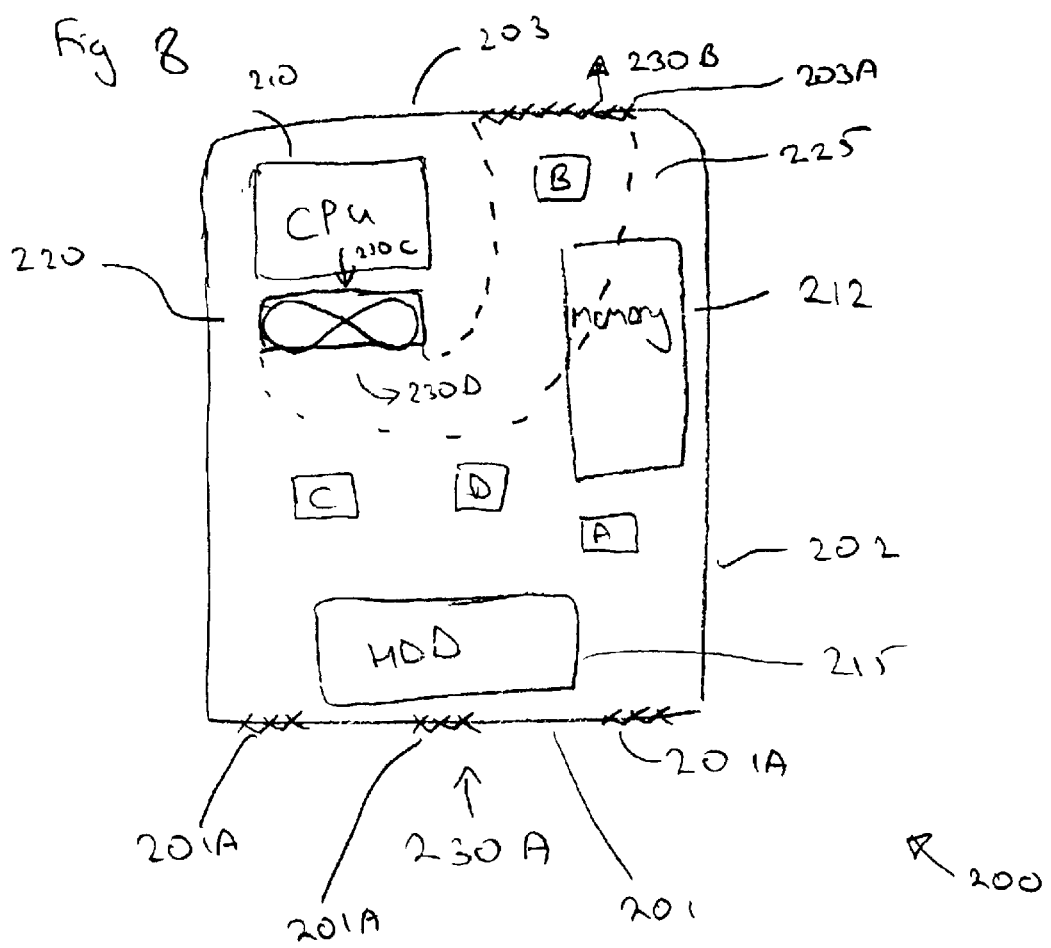

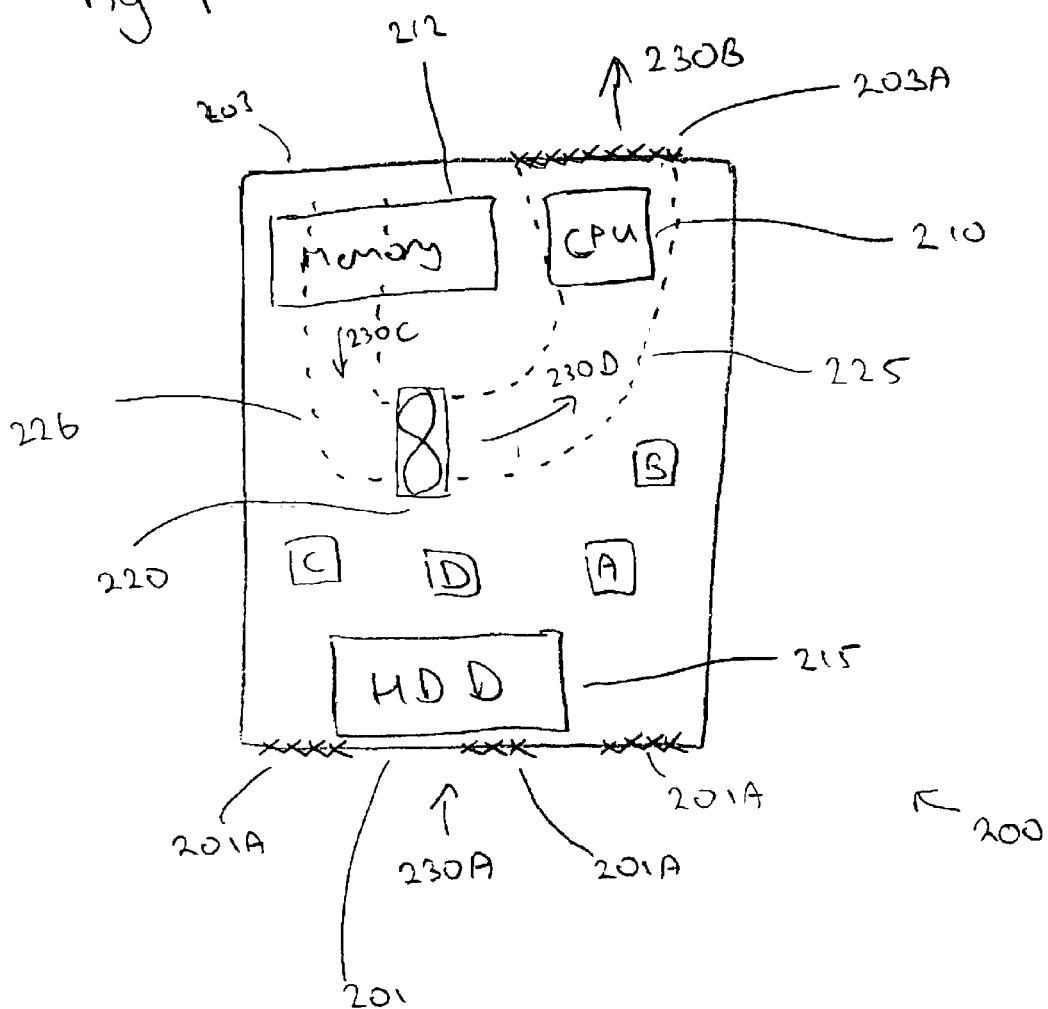

COMPUTING APPARATUS WITH COOLING FAN

FIELD OF THE INVENTION

The present invention relates to the use of a fan to cool computing apparatus within a single cavity, such as for a computer workstation or a blade within a rack-mounted server system.

BACKGROUND OF THE INVENTION

An important consideration in the design of a computer system is the cooling of the various components within the system cavity. As these components consume electricity in order to perform their desired operations, this electricity is primarily converted into heat through resistive processes. This heat must then be dissipated, otherwise the temperature of the various components will start to rise. If the temperature increase goes beyond the specified operating range of the system and/or its components, then some form of malfunction is likely to occur.

One component of a computing system that is particularly vulnerable to overheating is the CPU chip. This is because its power density tends to be higher than other components within the system. For example, a typical computer system may generate perhaps 100 W of heating power, with some 50% of this arising from the CPU itself. Consequently, the CPU may be producing some 50 W of heating power, despite usually having no more than a few square centimetres in surface area through which to cool. (It will be appreciated that quantitative numbers such as these are presented herein purely for the purposes of illustration, and will vary from system to system and with future hardware development).

A further reason for the relative vulnerability of the CPU chip is its fast signal timing, which generally renders it sensitive to overheating. Thus a CPU chip tends to have not only a high power density, but also a relatively low maximum operating temperature. These factors in combination mean that the CPU is generally the main focus of cooling in computer systems.

Modern computing systems usually rely on a controlled airflow to cool the various electronic components. The effectiveness of this airflow is primarily determined by two parameters, its volume or rate of flow, and its (initial) temperature. As regards the first of these parameters, computing systems almost always use a fan to increase the rate of airflow. Note that the fan can also be used to direct an airflow specifically past those components that are most vulnerable to over-heating (such as the CPU).

It is also important to prevent recirculation of air within a computer system cavity. Thus if such recirculation occurs, then the supposed cooling air will become gradually warmer with each pass over the electronic components, thereby reducing cooling efficiency. Ultimately, of course, if the airflow reaches the same temperature as the electronic components, it will not have any cooling effect at all.

In order to help avoid recirculation, computer systems are usually provided with vented cavities, to allow ambient air to be drawn into the cavity. This incoming air is at room temperature, (hopefully) significantly below the temperature of the electronic components within the cavity, and so provides effective cooling. For example, in a typical system the external packaging of a CPU may have an operational temperature of about 70° C. (the internals of the CPU will be somewhat hotter), and can be adequately cooled provided the incoming ambient air temperature for the computer system is below about 40° C. Of course, the room itself may be provided with air conditioning to maintain the room temperature at a satisfactorily low value.

Although in some circumstances it may be feasible to use passive venting to ensure an adequate ambient airflow into a computer cavity (based on natural convection, for example), in general at least one fan is used to actively drive this airflow. Thus one possibility is to locate a fan adjacent a vent so that it drives air through the vent and out of the computer system cavity. This will then automatically suck fresh room air into the cavity through other vents. Another possibility is for the fan intake to be positioned adjacent a vent, thereby drawing ambient air into the cavity. This in turn will automatically lead to air exiting the cavity through other vents.

FIG. 1 is an illustration of a typical known layout of a computer system 10, comprising a single cavity in which the various components of the computer system are contained. This configuration is typical, for example, of many personal computers. Two particular components within computer system 10 are shown in FIG. 1. One of these is the CPU 12, which as previously mentioned is normally the most significant source of heat within the cavity, and is usually responsible for some 25–75% of the total heat generated. The other component illustrated in FIG. 1 is a power supply 14, which is usually the second largest source of heat in the cavity. Note that since the power supply is based on analog electronics, it tends in practice to be somewhat more robust against a temperature increase than the miniaturised high-speed digital electronics of the CPU.

In most computer systems, the CPU (and potentially other components that are particularly vulnerable to over-heating) is placed in thermal connection with one or more heat sinks (not explicitly shown in FIG. 1). A heat sink is a structure usually made of metal for good heat conduction and typically provided with fins to maximise cooling area. A heat sink therefore serves to efficiently conduct heat away from its associated component(s) and then to dissipate the heat. This helps to prevent an undue temperature rise in the component(s) concerned.

Of course, it will be appreciated that computer system 10 will normally include additional components, such as a hard disk drive, memory, adapter cards, and so on (not shown in FIG. 1). In general, these have relatively minor cooling requirements, since the amount of heat that they generate is comparatively low.

In order to obtain the desired cooling within computer system 10, two fans are provided. A first of these fans 22 is located adjacent CPU 12. The primary purpose of fan 22 is to generate a high-speed cooling airflow in the direction of arrow 25C over the CPU 12, more particularly, in most cases, over the metal fins of its heat sink. Indeed, in some systems fan 22 and the CPU heat sink are provided in effect as a single unit, with the fan located on top of the heat sink and blowing air down into it.

However, fan 22 is unlikely by itself to be able to generate sufficient cooling airflow through or adjacent the other components within computer system 10, such as power supply 14. In addition, the use of fan 22 by itself may result in recirculation of air within computer system 10, rather than a through-flow of air from the external environment. This is because neither the intake nor the output of the fan is clearly directed through a cavity vent, both of these instead being located somewhat centrally in the cavity.

Consequently, computer system 10 is provided with a second fan 24, which is located on the rear wall 18 of the computer system. Fan 24 is operable to expel air out of the cavity of computer system 10 through suitable vents in the rear wall 18. This expelled airflow is indicated in FIG. 1 by arrow 25A. The loss of air from within the cavity of computer system 10 caused by fan 24 then has the effect of sucking in replacement air through vents provided in the front wall 19 of computer system 10. This replacement airflow is indicated in FIG. 1 by arrows 25B.

As a result, there is a general airflow through the cavity of computer system 10 from the front wall 19 through to and out of the back wall 18. This airflow is effective to cool all of the remaining components within the cavity, although by itself would normally not be sufficient to cool CPU 12 (hence the additional provision of fan 22). Note also that fan 24 is positioned approximately adjacent to power supply 14, which is also a relatively substantial generator of heat. Consequently, the air that will be ejected as represented by arrow 25A is primarily drawn past power supply 14, and so provides it with the necessary degree of cooling.

A further technique that is sometimes employed to enhance cooling in computer system cavities is ducting, whereby airflow either into a fan or out from the fan (or both) is guided along a constrained path. Such ducting can be used to direct or concentrate airflow over those components within the system that are particularly vulnerable to overheating. In addition, the ducting can help prevent unwanted recirculation of air within a computer system by connecting either the fan intake or output (or both) to the cavity vents.

FIG. 2 illustrates a computer system 10 that employs a form of ducting (this system is further described in U.S. Pat. No. 6,034,870). As in FIG. 1, computer system 10 includes a CPU 12 and a power supply 14 within a cavity having a front wall 19 and a back wall 18 (again, the other electronic components within the cavity are omitted from FIG. 2 for the sake of clarity). Note that in FIG. 2 there is only a single fan 30, which is placed and orientated so as to direct an airflow primarily towards the two main heat producing components of computer system 10, namely CPU 12 and power supply 14. Since it is the cooling of CPU 12 that is generally the most significant and important for correct operation of the system, the fan is located closest to the CPU, which will therefore receive the strongest cooling airflow (as indicated by arrow 25C). In contrast, power supply 14 is located slightly further away from fan 30, and will generally receive a lesser flow (indicated by arrow 25D), although this should still be adequate for cooling purposes.

Power supply 14 has a vented front wall 14A. In contrast, the side wall 14B of the power supply unit 14 is substantially impermeable to airflow. As a result, the cooling airflow 25D for the power supply 14 passes through wall 14A and is then constrained to travel back through the power supply, before exiting the cavity via vents in the rear wall 18 (as shown by arrows 25A).

Computer system 10 also includes a ducting wall 32. The effect of this is to constrain the airflow 25C between the side wall 14B of the power supply and the ducting wall 32 as it travels past CPU 12, and then exits the cavity, again via vents in the rear wall 18. By constraining airflow 25C in this manner, it is ensured that adequate cooling is provided to CPU 12. In addition, ducting wall 32 serves to deflect some airflow 25E from the fan to the left-most portion of the cavity, where various components (not shown) having generally less stringent cooling requirements can be located. Again, this airflow will exit the cavity through vents in the rear wall 18.

Also shown in FIG. 2 is wall 38, which in effect divides the cavity of system 10 into a fan inflow region, and a fan outflow region. Thus fan 30 draws air in through vents in the front wall 19 of the cavity, as indicated by arrows 25B, and then generates airflows 25C, D, and E, as described above. The use of wall 38 allows fan 30 to be positioned away from the front wall 19 without risk of recirculation, and can also provide certain advantages regarding the input impedance of the fan. Note that the ability to locate fan 30 away from front wall 19 allows it to be positioned in such a manner as to generate airflows 25C, D, and E of the required strength and proportion. It will be also appreciated that these airflows can also be controlled by suitably selecting the size, positioning and orientation of ducting wall 32 (in combination with the fan location, and other properties of the system).

A particular advantage of the configuration of FIG. 2 compared to that of FIG. 1 is that it only requires a single fan. This reflects a general desire to minimise the number of fans within a computer system for several reasons. Thus having multiple fans increases the cost of a system, both in terms of construction and also in terms of operation (the fans consume electricity). In addition, fans produce noise, which can be distracting or irritating for the user of a computer system. Furthermore, and perhaps most importantly, fans are mechanical devices subject to wear and tear, and hence somewhat unreliable compared to the other semiconductor and electronic components of a computer system.

It will be appreciated therefore that the more fans that are included in a computer system, the greater the likelihood that one of them will fail during the lifetime of the system. Such failure will then result in the need to replace the broken fan unit, and there may also be knock-on effects caused by overheating while the fan was not operational (for example, semiconductor components may degrade if allowed to go above their specified operating temperature).

Some systems therefore include multiple fans simply to ensure a level of redundancy, so that even if one fan fails, the remaining fan(s) can still provide sufficient cooling for the system to continue proper operations. This strategy is frequently adopted for a server environment, where it is important to keep system downtime to an absolute minimum. Although this approach does help to mitigate the adverse consequences of fan failure, in other ways it exacerbates the problems by increasing the number of fans in the system. Thus this adds to the expense and running costs, and also increases the risk that system will indeed experience the failure of at least one fan unit during system lifetime. Such systems therefore usually have to be designed to permit relatively easy access to and replacement of a failed fan unit.

Returning now to the configuration of FIG. 2, it will be appreciated that this has only a single fan, and so does successfully minimise the number of fans required. Nevertheless, the arrangement shown in FIG. 2 is still subject to certain deficiencies. Thus the positioning of CPU 12 within the cavity is relatively inflexible. Rather, it must be located in the front central portion of the computer system cavity, in order to ensure that it receives sufficient cooling airflow from fan 30. In addition the degree of cooling in the two front corners of the computer system cavity is rather low, and accordingly these must either remain empty or be occupied by components that do not generate heat, or have only minimal cooling requirements.

Such physical constraints on the layout of system components are becoming more significant, particularly as designers strive to make systems as compact as possible.

This is motivated partly by operation at ever increasing frequencies, and with ever increasing bandwidths. For example, a typical processor nowadays has a clock rate of 1 GHz, and the light travel time (in vacuum) for one clock cycle is consequently only 0.3 m. This therefore represents a fundamental limit on the possible physical separation of certain components. (Of course, not all parts of the system are clocked at the same rate).

It is also important for other reasons to try to reduce the lengths of connections between various components. Thus this helps to minimise the loss of analog signal shape and timing as a signal propagates along a connector (caused by various physical properties of the connector itself), and also reduces the risk of picking up interference from stray electromagnetic fields. Moreover, it will be appreciated that the shorter a connector is, the less power is required to transmit a signal through it.

Such concerns mean that there is constant pressure to increase the volumetric density of components in a computer system (especially those not subject to the historical form factors that constrain personal computers). At the same time, it is important to maintain the flexibility of the system designer to optimise the location of the various components within the system, for example to reduce the length of the required inter-component connections, and to maximise the use of available space. This in turn puts greater demands on the cooling system. However, any increase in the number of fans employed is undesirable, in order to avoid degraded reliability and additional costs.

SUMMARY OF THE INVENTION

Thus in accordance with one embodiment of the invention there is provided computing apparatus including a housing that defines a cavity. The computer apparatus further includes within the cavity multiple computing components and a fan for generating an airflow to cool the computing components. The fan has a first path defining an air inflow and a second path defining an air outflow. One of these first and second paths is ducted to a vent facility in a first wall of the housing, while the other one of the first and second paths communicates with the cavity adjacent the first wall.

The computing apparatus may for example be the system unit of a personal computer, workstation, thin client, or any similar standalone system, or one component (such as a blade) of a rack-mounted or other form of modular server system, in which each component has a single cavity. The above configuration typically enables such apparatus to be cooled with only a single fan, thereby saving costs and improving reliability. At the same time flexibility of component layout within the cavity can be preserved.

In one embodiment, a vent facility is also included in a second wall of the housing opposite the first wall, but there is no additional ventilation in the first wall (other than through the ducting). The second vent facility communicates with the cavity, and so the airflow path will draw air into the cavity or expel air out of the cavity (as appropriate) using this second vent facility. As a result, a cooling airflow will be generated along substantially the entire body of the cavity, between the first wall and the second wall, thereby permitting a wide range of possible locations for the various components within the cavity.

Typically the first wall is a rear wall of the apparatus, while the second wall is a front wall of the apparatus, and it is the second path that is ducted to the vent facility in the first wall. Thus the air outflow is directed to the rear of the apparatus, producing an overall cooling airflow within the cavity that is generally in the direction from the front to the back of the apparatus. Note that another way of achieving the same overall direction of airflow is where the first wall is a front wall of the apparatus, the second wall is a rear wall of the apparatus, and it is the first path that is ducted to the vent facility in the first wall.

In one embodiment, a computing component representing a primary heat source within the cavity is positioned in the first or second path. Such a location helps to ensure a strong airflow over and around the primary heat source, thereby providing good cooling. The computing component that is most typically the primary heat source is a central processing unit (CPU), comprising one or more processors. The particular vulnerability of the CPU to over-heating means that it is generally attached to a heat sink, which can be suitably positioned in the first or second path adjacent the fan.

Note that a strong cooling airflow past the CPU can be obtained if the CPU is positioned either adjacent the fan, or somewhere in the ducted path to the vent facility. In terms of the latter possibility, because the ducting maintains the airflow within a constrained volume, the flow velocity remains strong even away from the fan. This therefore allows the CPU to be positioned at any suitable location along the ducting. It will also be appreciated that the airflow in the ducting can be used to cool components other than the CPU if so desired, by choosing a suitable route for the ducting past the components concerned (or conversely by locating the relevant components within the path of the ducting).

The cavity is often cuboid in form (although other shapes can be accommodated), with the first wall being selected in one embodiment so that the dimension perpendicular to the first wall represents the longest dimension of the cavity. This helps to ensure that the general airflow within the cavity passes through as high a proportion of the cavity volume as possible, in order to optimise cooling of the components therein. Typically this longest dimension is arranged from the front to the back of the apparatus, with the cooling airflow therefore travelling generally from the front to the back of the apparatus. (Of course, it will be appreciated that the approach described herein supports a wide range of other geometries and relative dimensions).

In one embodiment, the fan comprises a centrifugal fan, which has an axial intake of air, and then a tangential (centrifugal) output. This is particularly convenient when one of the dimensions of the first wall is relatively short. In this case the axis of the fan can be arranged to lie parallel to this relatively short dimension (and the first wall), so that the radial size of the fan, and hence degree of cooling obtained, is not unduly restricted. However, in other embodiments it may be more advantageous to use a different type of fan (such as an axial or radial fan). This will be dependent on a wide range of parameters, including factors such as power requirements, noise, reliability, cost, airflow capacity, and so on.

Typically the computing components within the cavity are attached to a card or printed circuit board (PCB) adjacent to or forming a third wall of the housing that is perpendicular to the first wall. The ducting to the vent facility can then be attached to or adjacent to a fourth wall of the housing opposite the third wall. In this manner, the ducting can avoid the various components on the PCB (other than those particular components, if any, that it is intended to specifically cool).

In one embodiment, whichever one of the first and second paths that is ducted to the vent facility in the first wall starts from the fan in a general direction away from the first wall, and then is guided back by the ducting to the first wall. This allows the other path to be positioned as close as possible to the first wall, resulting in an airflow that travels the full length of the cavity, and so cools the full set of components therein. Note that if the CPU is included within the ducted path to the vent facility, then such a configuration typically leads to the fan being geometrically located between the CPU and the first wall.

A further possibility is for whichever of the first and second paths that communicates with the cavity adjacent the first wall to also be ducted. This can be regarded as an internal duct, since it terminates within the cavity, in contrast to the ducting to the vent facility, which communicates with the exterior of the cavity. An advantage of using such an internal duct is that it allows the fan to be physically positioned away from the first wall, while still ensuring that an input or exit path of the vent communicates with the cavity adjacent the first wall. This internal ducting can be constructed in a similar manner to that described above for the ducting to the vent facility.

In accordance with another embodiment of the invention there is provided a method of cooling computing apparatus. The computing apparatus includes a housing that defines a cavity, and further includes within the cavity multiple computing components. The method comprises the steps of generating with a fan an airflow to cool the computing components, wherein a first path defines a fan air inflow, and a second path defines a fan air outflow; and ducting one of the first and second paths to a vent facility in a first wall of the housing, wherein the other one of the first and second paths communicates with the cavity adjacent the first wall.

It will be appreciated that such a method will typically benefit from the same particular features described above in relation to the apparatus of the invention.

BRIEF DESCRIPTION OF THE DRAWINGS

Various embodiments of the invention will now be described in detail by way of example only with reference to the following drawings in which like reference numerals pertain to like elements and in which:

FIG. 8 is a schematic illustration of another alternative arrangement of the internal components of a blade from the rack-mounted system of FIG. 3; and FIG. 9 is a schematic illustration of another alternative arrangement of the internal components of a blade from the rack-mounted system of FIG. 3.

DETAILED DESCRIPTION

Figure 1:
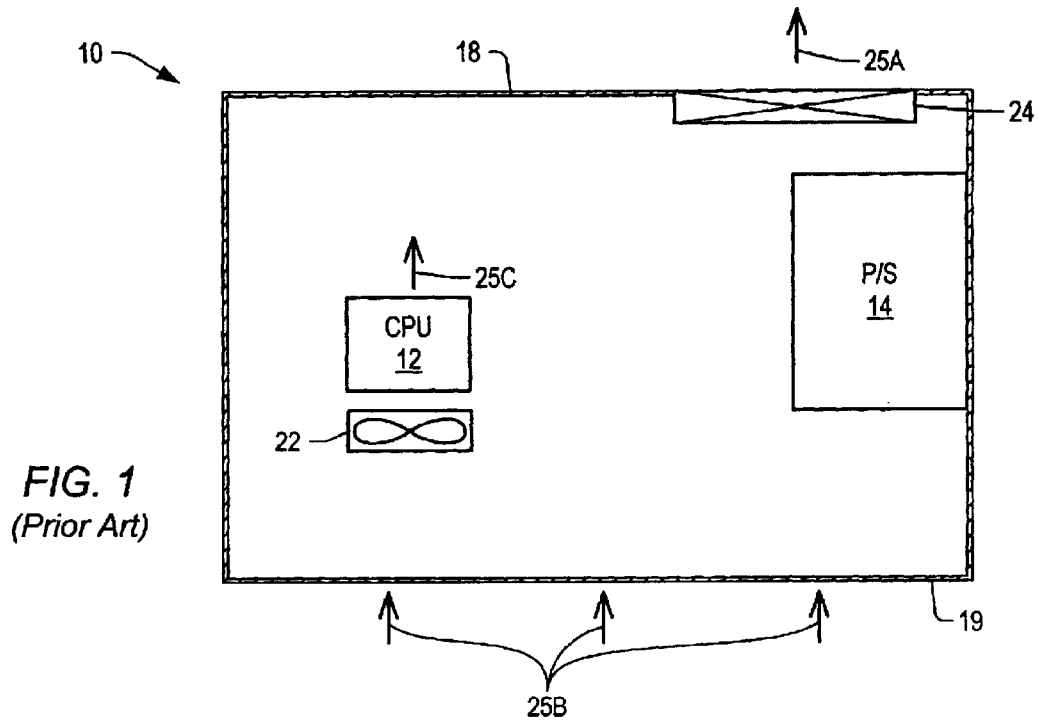
FIG. 1 is a schematic illustration of the layout of certain components within a typical known personal computer system.
Figure 2:
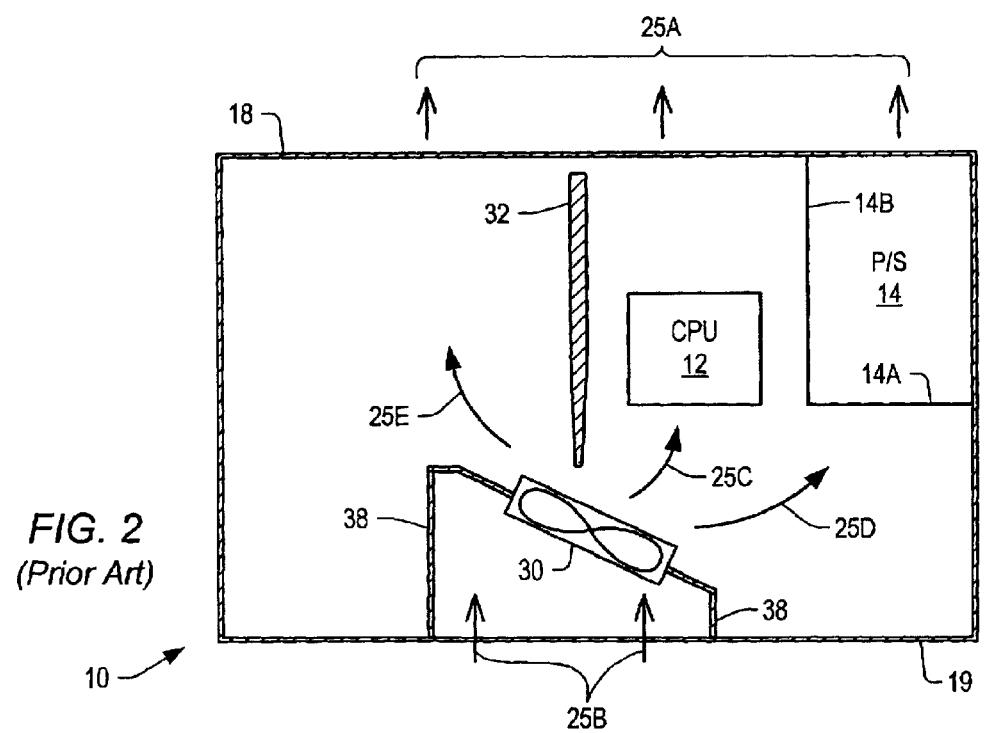
FIG. 2 is a schematic illustration of an alternative layout of certain components for a known computer system employing ducting.
Figure 3:
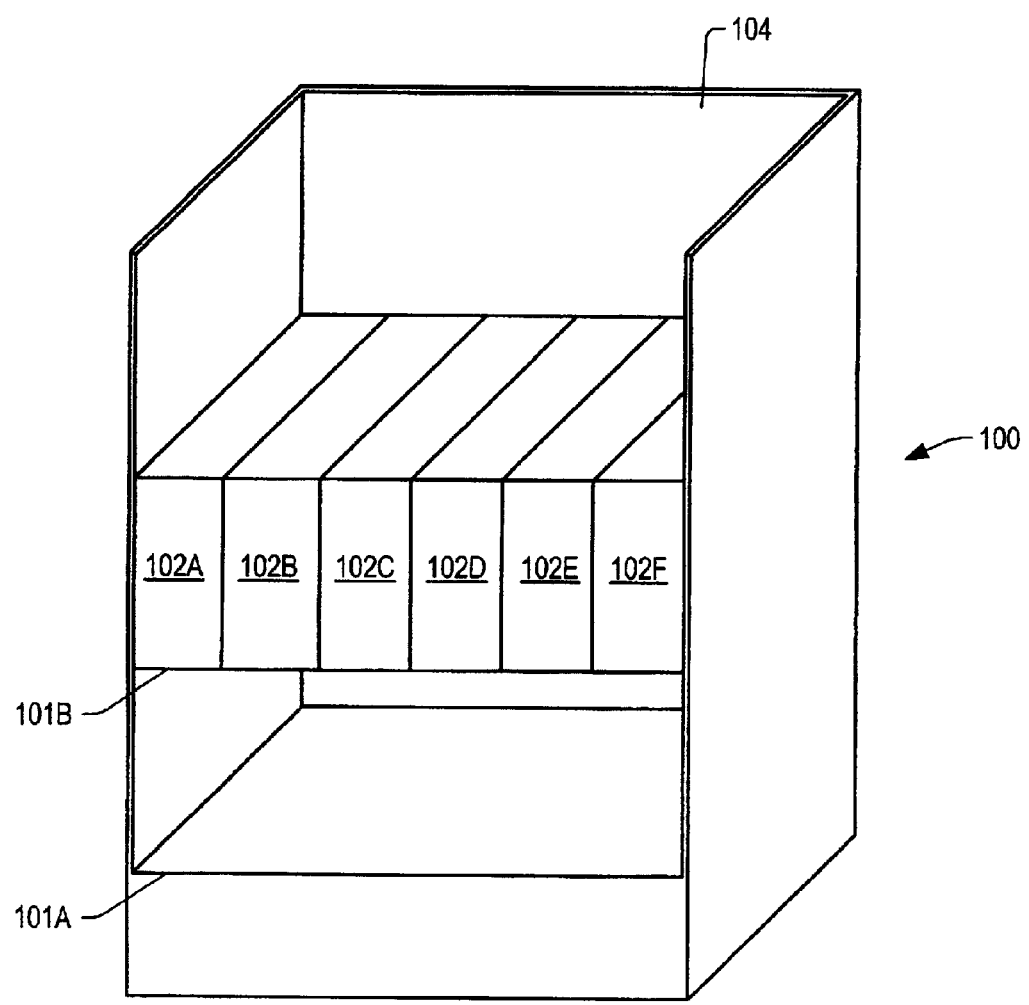
FIG. 3 is a schematic illustration of a modular, rack-mounted computer system.

FIG. 3 is a schematic illustration of a modular, rack-mounted computer system 100, comprising one or more shelves 101A, 101B, each of which can contain a plurality of removable modules known as blades 102A, 102B . . . 102F. The blades represent individual computing units that are provided with their own processor(s), memory, disk storage, and various other components to allow each blade to function in a largely stand-alone manner.

Although the blades are shown in FIG. 3 as complete, independent units, they may in practice share certain facilities within shelf 101, for example a power supply and/or interface units to external network connections. Note that if a rack or shelf power supply is provided, this typically performs AC/DC conversion from the mains, and distributes DC power to individual power units within each blade. These power units are then responsible for sourcing power to the various components within a blade itself.

Any shared shelf facilities are typically located at the rear of the system, adjacent back wall 104. Note that the connections between the blades and these shared facilities are designed to support both easy removal of a blade unit 102 from its shelf 101, and conversely easy insertion of a blade unit back into the shelf.

The architecture of rack system 100 is highly scalable, in that the number of blades present can be adjusted to obtain the desired overall computing facility. In addition, a certain level of redundancy can be provided to ensure a robust system that can tolerate the failure of an individual blade. For example, in the event that one blade does indeed fail, its processing load may be transferred to another (redundant) blade, maintained as a back-up or standby, or alternatively its processing load may be distributed out amongst the remaining functional blades. (Note that if a shelf 101 or the rack 100 relies on one or more shared facilities, then it is normal to provide these with a certain degree of redundancy or fault tolerance as well).

Although blade units 102 are generally expected to conform to a common architecture they may not necessarily all be identical. For example, there may be different types or flavours of blade, such as those having more memory and/or a higher-powered processor. In addition, although shelf 101B is shown in FIG. 3 as being full of blades, and shelf 101A is shown as being empty of blades, it will be appreciated that it is quite possible for a shelf to be partly occupied with blades.

As discussed above, there is an increasing requirement to raise the density of components within a computer such as rack-mounted system 100. This implies both packing components more closely together within an individual blade, and then packing the blades more closely within an individual shelf (and then the shelves more closely together as well). In fact, the typical size of a blade is already rather small, for example about 25 mm wide and 125 mm high (both as viewed from the front), and 300 mm long (from front to back), although of course these dimensions will vary both in absolute terms and also in relative terms, according to the particular needs of any given embodiment.

It will be appreciated that such compactness causes difficulty from a cooling perspective, since the amount of heat generated within any given volume is increased, while the amount of unoccupied space in and around the cavity through which to drive a cooling airflow is reduced. In these circumstances it becomes particularly important to avoid the recirculation of air within the system cavity, because in such a confined volume, there is no opportunity for recirculated air to cool down, and so cooling efficiency is rapidly diminished. (This is in contrast to many older systems, in which the proportion of space within a system cavity actually occupied by components was somewhat smaller, and a certain degree of recirculation could be tolerated).

System 100 includes cooling fans (not shown in FIG. 3) to draw ambient air in from the front of the system. This air is then passed through the blades 102, thereby cooling them, before being expelled out of the back of the system, through appropriate openings in rear wall 104 that can be formed by a wired mesh, by a grating, or by any other suitable ventilation facility. Note that the individual blades can be regarded as separate cavities, in that there is no (transverse) airflow from one blade into another. Rather there is only airflow in through the front of a blade, and then out through the back of the same blade.

In some rack-mounted systems there may be cooling fans mounted at the back of a shelf 101, and typically shared between two or more blades. Such shared fans enhance the overall airflow through each blade, and help to prevent recirculation of air within the blades. However, they are relatively ineffective at directing cooling air to those components within a blade that are most vulnerable to overheating, in particular the CPUs.

Figure 4:
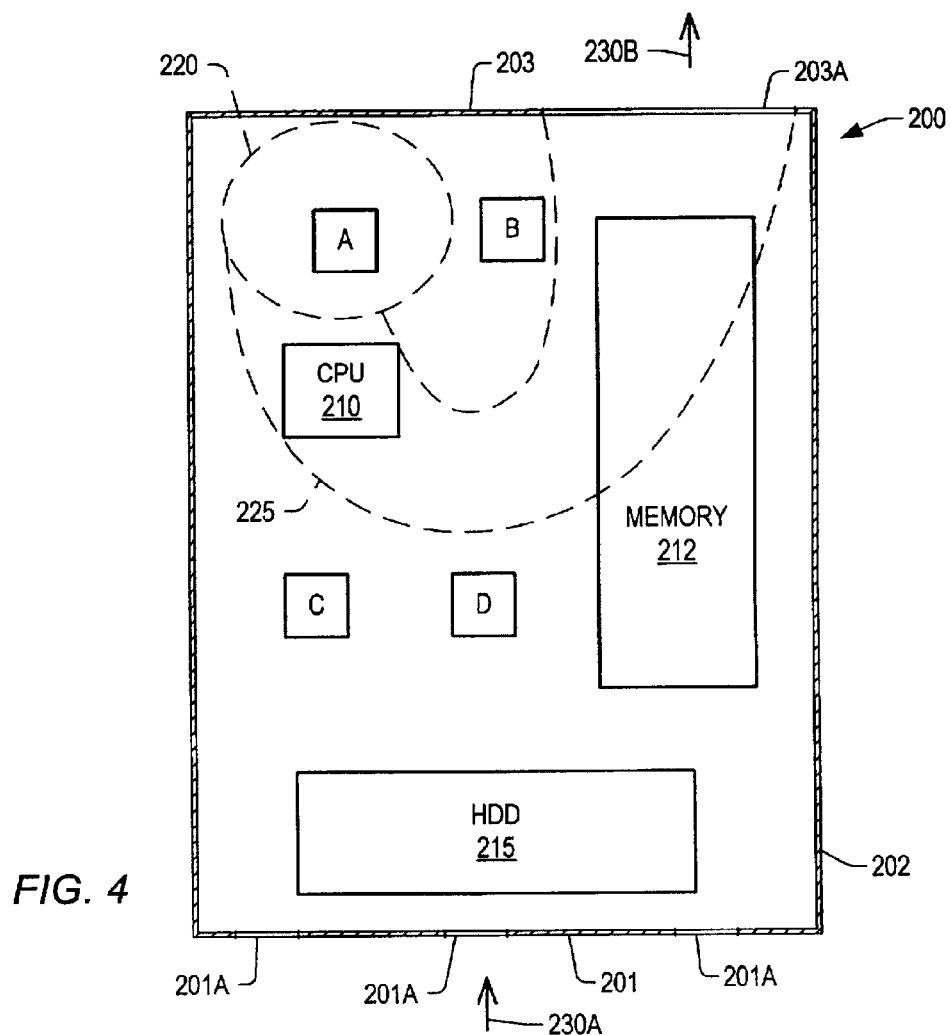
FIG. 4 is a schematic illustration of the internal components of a blade from the rack-mounted system of FIG. 3.

Accordingly, each blade includes its own fan, as illustrated in FIG. 4, which depicts an individual blade 200 from within the rack-mounted system. The three primary computing components of blade 200 are the CPU 210, the hard disk drive (HDD) 215, and memory 212. Other various components are also likely to be present within the blade cavity, and these are depicted generically in FIG. 4 by blocks A, B, C and D. However, the purpose (and precise location) of these other components is not of direct relevance to the present invention. The above set of components are typically bonded to a card which may form the base of blade 200, which also supports the necessary electrical interconnects between the various components.

(Note that for ease of understanding, references to the depth dimension of FIG. 4 should be as interpreted as perpendicular to the surface of the paper, although after installation into the rack of FIG. 3 this dimension will in fact be orientated horizontally across the width of a blade. Similarly, wall 201 then represents the front surface, wall 203 represents the rear surface, and wall 202 represents the underneath surface of the blade 200, all after installation into rack 100. On the other hand, it will also be appreciated that some rack systems have a different orientation from that shown in FIG. 3; for example, the blades may be stacked vertically rather than lying side by side).

As previously indicated, the CPU 210 is normally the most important component within blade 200 from a cooling perspective. Thus the CPU tends not only to generate the greatest quantity of heat, but also to have the most restrictive permitted operating temperatures in view of its fast signal timing. Typically therefore the CPU 210 is provided with a heat sink on its upper surface, which is usually formed as a set of metallic cooling fins. Blade 200 further includes a fan 220. This is depicted in FIG. 4 using dashed lines because it is out of the plane of (above) the other components so far discussed. As will be explained below in more detail, fan 220 is a known form of centrifugal fan, which has an axial intake of air. In the context of FIG. 4, this means that its intake is drawn from the region of the blade cavity directly underneath the fan. Fan 220 then expels air in a centrifugal (tangential) direction. In particular, fan 220 is so arranged that the airflow it generates is constrained to enter and then follow ducting 225. Again, this ducting is shown by a dashed line in FIG. 4 to indicate that it is situated above the other components within blade 200.

The ducting 225 defines an exit path for the airflow generated by fan 220 such that this airflow passes directly over the CPU 210 (more particularly, the cooling airflow will pass around and in-between any cooling fins attached to the CPU). It will be appreciated that this represents a significant cooling airflow, and is therefore adequate to maintain CPU 210 at its correct operating temperature. After the airflow has passed over CPU 210, it continues within ducting 225, which guides it to the rear wall 203 of the blade 200. It then passes through suitable vents 203A in rear wall 203 in order to exit the blade 200, as depicted by arrow 230B.

It will be appreciated that this egress of air from the rear of the blade requires a compensating flow of replacement air to be drawn into blade. This is achieved by providing vents 201A in front wall 201, thereby permitting the entry of ambient cooling air as depicted by arrow 230A. Note that the only vent in rear wall 203 is vent 203A, which communicates with the ducting 225, and which is utilised for the exit of air, as shown by arrow 230B. Accordingly, there is no intake of air into blade 200 through the rear wall 203.

Thus the overall airflow within blade 200 is that air is drawn into the cavity by fan 220 through vents 201A in the front wall of the blade. This airflow then travels through the blade, to the intake of fan 220 at the rear of the cavity. In making this journey, which corresponds to substantially the entire length of the blade, the airflow serves to cool all the various components within the blade 200.

For the majority of components within blade 200, this general airflow provides adequate cooling. However, this is not normally the case for the CPU 210, because of its particularly demanding cooling requirements. Nevertheless, this is accommodated with the design shown in FIG. 4, in that as already explained, the fan 220 specifically drives its output of air through the ducting 225 and over CPU 210. The constrained path within ducting 225 results in a more focussed and intense airflow, which does indeed provide the desired degree of cooling for CPU 210.

Once the airflow has been used to cool CPU 210, it then passes further along ducting 225 until it exits from blade 200 through vent 203A. The forced expulsion of air in this manner from blade 200 prevents recirculation of air within the blade, and so ensures a proper through flow of air from the front to the back of the blade. Note that this obviates the need for any additional shared fans provided at the back of shelf 101 or rack 100, although such shared fans can be included if desired (for example as a fail-safe measure).

It will be appreciated that the vents 201A and 203B in the cavity can be formed in any appropriate manner, for example, a grating, a wire mesh, slits in the cavity wall, and so on. In addition, the number and location of the vents will vary from one embodiment to another in order to achieve the desired airflow, and in accordance with particular design requirements. For example, the left and right front vents 201A might possibly be moved to the side walls (particularly the front portion thereof), provided adequate cooling airflow was still drawn in past components at the front of the cavity 200, such as HDD 215.

Figure 5:
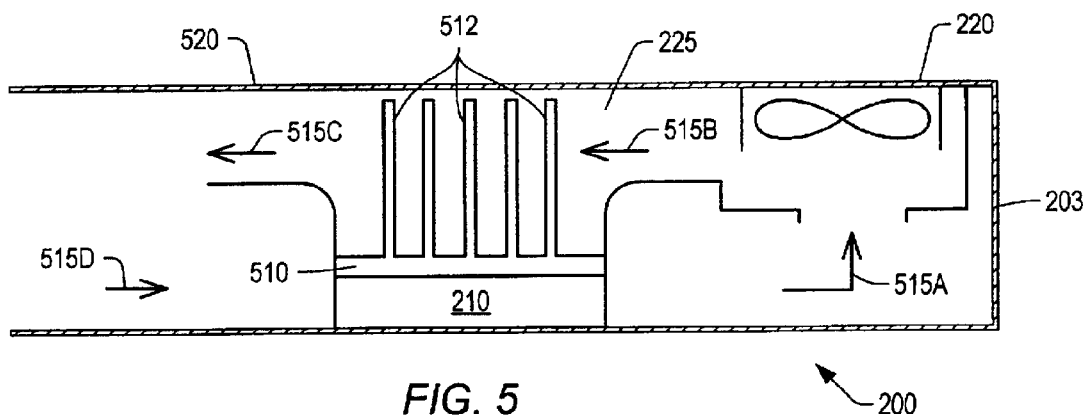
FIG. 5 is a schematic cross-section of a detail from the blade of FIG. 4, illustrating the fan and CPU in particular.

FIG. 5 shows a schematic cross-section of the blade unit 200 from FIG. 4 in the region of fan 220 and CPU 210 (omitting component A for the sake of clarity). In particular, CPU 210 is attached to the bottom of blade unit 200 and surmounted by a heat sink 510. This heat sink incorporates multiple metallic fins 512, which can be provided in any suitable configuration.

(It will be appreciated that the heat sink fins are shown schematically only. Thus in practice a typical heat sink may have fins extending in parallel with the direction of the airflow, or a much larger number of studs or other protrusions than shown in FIG. 5, and these can extend the full height of the cavity. In addition, the heat sink may also extend somewhat beyond the periphery of CPU 210).

The fan 220 is attached to the roof of the blade unit, and in this embodiment is a centrifugal fan. Thus fan 220 draws in air from an axial direction, as indicated by arrow 515A, and expels air in a tangential (centrifugal) direction, as indicated by arrow 515B. A typical power rating for fan 220 is in the range 0.25–2.5 W, but it will be appreciated that this is by way of illustration only. Other systems may utilise fans with power ratings outside this range, depending on the particular requirements arising from cavity shape, size and layout, and the heat outputs and cooling needs of the various components included within the cavity.

Ducting 225 is provided in order to confine the airflow from fan 220 to a particular azimuthal range, so that the airflow from the fan is directed towards the CPU 510 and its heat sink 512, as indicated by arrow 515B. By constraining the airflow generated by fan 220 to a relatively narrow path, as defined by ducting 225, a relatively high air velocity is achieved. This ensures a high degree of cooling for heat sink 512 and CPU 210.

After the airflow from fan 220 has passed the CPU 210, it continues along ducting 225 as indicated by arrow 515C. The ducting then directs the airflow out of the cavity via the rear wall of the blade unit 203 (as shown in FIG. 4).

Note that away from CPU 210, the ducting 225 only occupies the top portion of the cavity within blade unit 200. This allows cooling air from the front of the cavity to progress through the blade unit under ducting 225, as indicated by arrow 15D, and around CPU 210, until it reaches the entrance to fan 220 (indicated by arrow 515A). Ducting 225 does include a somewhat enlarged portion adjacent CPU 210 in order to encompass the entire heat sink 512. This is to maximise cooling efficiency of the CPU 210. Nevertheless, in other embodiments, it may be that only selected portions of heat sink 512 protrude into the ducting region, although this will of course generally reduce the degree of cooling provided to the heat sink.

Note that ducting 225 is typically made from moulded plastic, since such a material can be easily shaped and is non-conductive, thereby giving greater installation freedom. Nevertheless, any other suitable material(s) could be used, such as folded card/paper stock, moulded or stamped foam, stamped or die-cast metal and so on (or any appropriate combination of the above). In addition, the ducting can conveniently employ existing surfaces within the cavity, such as the enclosure walls, a printed circuit board at the base of the blade, the heat sink, etc. It will be seen that this approach is adopted by the embodiment illustrated in FIG. 5, in that the ducting 225 is formed partly by the top surface 520 of the blade 200 and also partly by the base of the heat sink 510.

Figure 6:
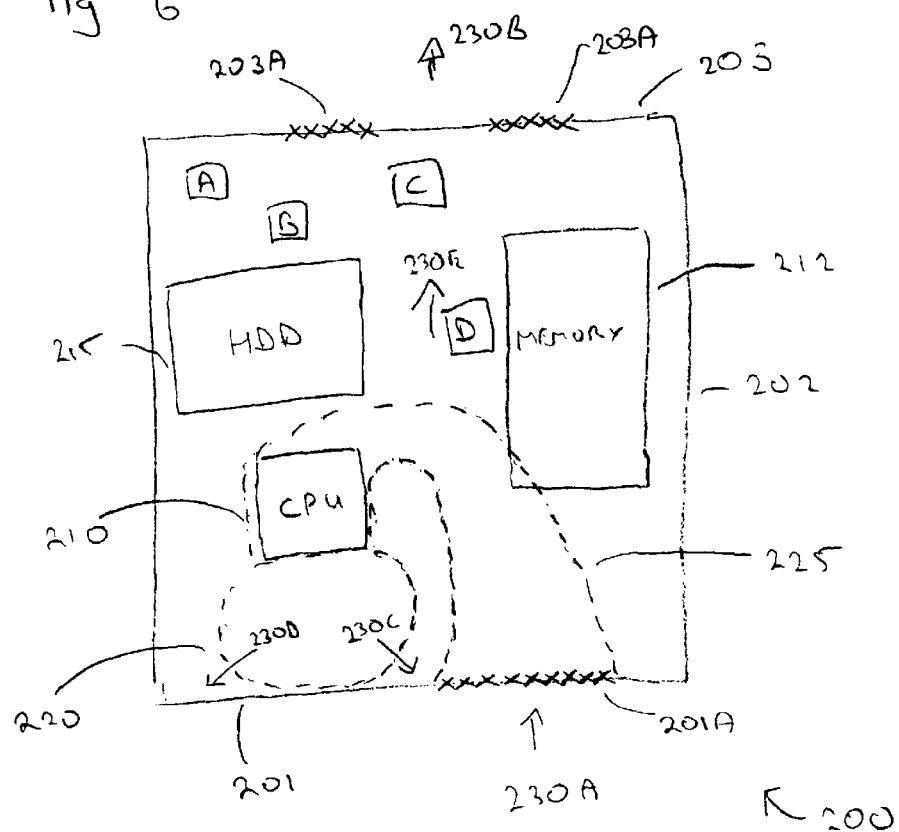
FIG. 6 is a schematic illustration of an alternative arrangement of the internal components of a blade from the rack-mounted system of FIG. 3.

FIG. 6 illustrates an alternative embodiment of the invention, representing another possible layout for the various components within blade system 200. For ease of comparison, the various components within system 200 are the same as shown in FIG. 4, namely CPU 210, HDD 215, and memory 212, plus some non-specified components A, B, C, and D (although it will be appreciated that the invention is not limited to use only with this, or any other, particular combination of components).

Blade 200 also includes a fan unit 220 and ducting 225, shown as before by a dashed line. Unlike in FIG. 4 however, the ducting of FIG. 6 is connected to the front wall 201 of the blade. Therefore fan 220 draws in air as indicated by arrow 230A through appropriate vents 201A in the front wall 201 via ducting 225. (It will again be appreciated that there are no vents in front wall 201, other than those that connect with ducting 230A).

Included within the ducting 225 is the CPU 210, plus its associated heat sink (if any). Assuming that fan 220 is again a centrifugal fan, ducting 225 communicates with the underneath of fan 220. Air is therefore drawn into ducting 225 through vent 201A in the front wall 201 of the system, and travels along ducting 225 and past CPU 210, thereby cooling the CPU. When the air arrives at fan 220, it is then ejected, typically in the direction of the front wall 201 of the blade 200, as indicated by arrows 230C and 230D.

Since air is unable to exit the cavity through the front wall of the blade 200, the airflow generated by fan 220 accordingly makes its way to the rear wall 203. An appropriate ventilation facility 203A is incorporated into this rear wall, to allow air to leave the blade, as indicated by arrow 230B. Note that as this airflow passes from fan 220, located at the front portion of the blade, all the way to the rear portion of the blade, the various components located in the blade and passed over (or around) by the airflow will be suitably cooled. It will therefore be seen that the overall operation of FIG. 6 is to some extent the converse of that of FIG. 4 (ducted to the front wall rather than the back wall); nevertheless, both serve to provide good cooling characteristics within a single cavity computer system.

Figure 7:
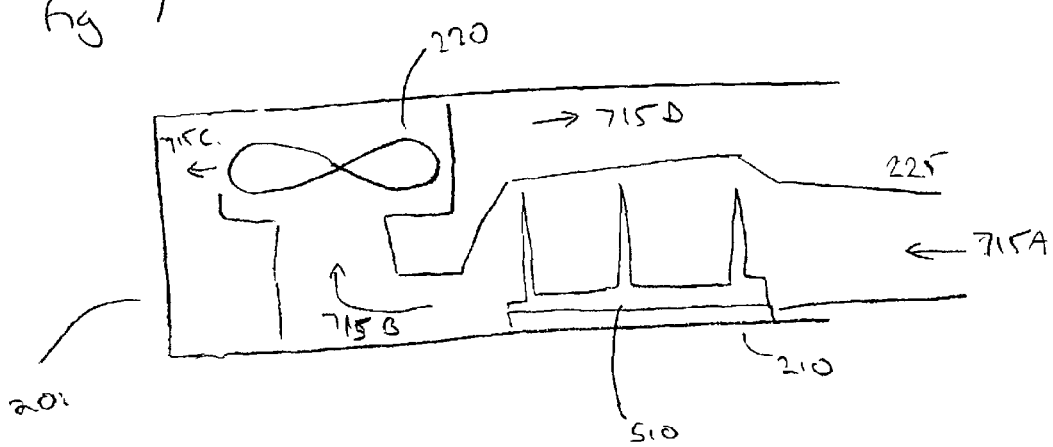
FIG. 7 is a schematic cross-section of a detail from the blade of FIG. 6, illustrating the fan and CPU in particular.

FIG. 7 shows in schematic form a cross-section through one portion of the blade 200 shown in FIG. 6. Thus ducting 225 guides an airflow from appropriate vents in the front wall 201 towards the CPU, as indicated by arrow 715A. Because CPU 210 and its associated heat sink 510 are located within ducting 225, they receive a constrained and therefore relatively high velocity airflow. (Note that ducting 225 fully encompasses CPU 210 and heat sink 510 in order to maximise cooling efficiency). Consequently, CPU 210 is prevented from over-heating, despite the fact that it is such a strong heat source.

After the airflow through the ducting 225 has cooled the CPU, it is further directed by the ducting up into fan 220, as indicated by arrow 715B. The inflow into fan 220 is then converted by the fan into a centrifugal outflow, generally towards wall 201, as indicated by arrow 715C. Since however this air is unable to exit the blade cavity through front wall 201, it makes its way around fan 220, over ducting 225, and towards the rear portion of blade 200, as indicated by arrow 715D. In doing so, this airflow provides adequate cooling for those components within blade 200 that are less intense heat sources than CPU 210.

A further embodiment of the invention is illustrated in FIG. 8 (which again, purely for the sake of consistency, depicts the same set of basic components as FIGS. 4 and 6). The layout is broadly similar to that of FIG. 4, except that CPU 210 is now located much closer to a rear corner of blade 200. In addition, a different type of fan is being used, in that fan 220 in FIG. 8 is a conventional axial fan, as opposed to a centrifugal fan.

In operation, fan 220 serves to drive air initially towards the front wall 201 of the blade cavity, but this outflow from fan 220 is then constrained by ducting 225. As a result, the airflow is directed by the ducting back towards the rear wall 203 of the blade cavity. The airflow then exits through suitable vents 203A in this rear wall, as indicated by arrow 230B.

The intake of fan 220 is depicted by arrow 230C. This intake is directly adjacent CPU 210, and so a relatively strong cooling airflow passes over CPU 210, thereby providing the desired degree of cooling. Airflow 230C is fed via appropriate ventilation 201A in the front wall 201 of the blade cavity, which draws in external air as indicated by the arrow 230A (there is no facility for air to enter the cavity through rear wall 203). This airflow then makes its way generally to the rear of the blade cavity, cooling the various components within the cavity as it passes by them. Eventually this air is drawn towards the intake to fan 220, and becomes part of airflow 230C.

In comparison with the layout of FIG. 4, it will be noted that FIG. 8 has the CPU 210 positioned in the corner of the blade. It will be appreciated that in practice this is generally less common (and perhaps convenient) than a more central location for the CPU 210, which of course can be considered as the hub of computational activity within blade 200. In addition, the axial fan within blade 200 must fit within the shortest dimension of the blade (i.e., its width, when installed into a rack system, such as shown in FIG. 3). This therefore imposes a limit on the possible size of fan 220, which in turn restricts the amount of cooling that it can provide. In contrast, it will be appreciated that a centrifugal fan, such as shown in FIG. 4, is not directly impacted by this constraint, due to its different orientation.

Of course, in other embodiments the size of the cavity may be such that an axial fan can be accommodated without difficulty. This may for example be the case for personal computer systems, which tend not to have such a short dimension as a blade. Likewise there may be particular reasons for placing the CPU in the corner of the blade. In this context, it will be recognised cooling issues are normally only a secondary consideration in determining the layout of components within a system. Often the configuration is governed primarily by electrical/mechanical factors, and then the cooling must be adapted to suit the selected layout.

A further difference between the configurations of FIG. 4 and FIG. 8 is that in the former the CPU is located downstream of the fan, while in the latter it is located upstream. Optimum fan efficiency usually puts the major flow restrictions, such as a heat sink, downstream of the fan (as shown in FIG. 4), but an upstream location may nevertheless be used to generate the cooling airflow for a CPU, particularly if there are other factors (such as mentioned above) that motivate such a configuration.

FIG. 9 depicts another embodiment of the invention, illustrating a further possible configuration of the various components. For ease of comparison, this embodiment contains the same basic devices as before within the blade cavity 200, namely CPU 210, memory 212, and HDD 215, plus various non-specific units A, B, C, and D.

A cooling airflow is generated by an axial fan 220 located substantially in the centre of the cavity. The airflow 230D produced by fan 220 is constrained by ducting 225 (shown by a dashed line), to travel to a vent facility 203A in the rear wall 203 of the blade. The CPU 210 (with associated heat sink) is located within this ducting 225, in a similar manner to that shown in FIG. 5. After this airflow has cooled CPU 210, it exits the cavity, as indicated by arrow 230B. Note that the use of ducting 225 allows the CPU 210 to be adequately cooled even although it is positioned some distance from fan 220, since the ducting ensures that the airflow 230D from fan 220 maintains its definition.

Unlike previous embodiments, the configuration of FIG. 9 has ducting on both the inflow and outflow sides of fan 220. The ducting 226 on the inflow side (also shown in dashed line) can be regarded as internal, in that it does not lead to an external vent, but rather communicates with a region of the cavity adjacent the rear wall 203. Therefore the air inflow for the fan, as indicated by arrow 230C, is drawn from the rearmost portion of the cavity. This in turn will draw in replacement air through vents 201A in the front of the cavity, as indicated by arrow 230A. This replacement air will then traverse the entire length of the cavity in order to reach the input to ducting 226, cooling the various other components in the cavity in the process.

The overall pattern of airflow within cavity 200 in FIG. 9 is therefore generally similar to that of FIGS. 4 and 8. However, the use of internal ducting 226 on the fan inflow allows the fan to be located away from the rear wall, thereby giving more flexibility in the layout of the components within the cavity. Note that internal ducting can also be used if desired on the fan output, where the fan input is connected to an external vent facility (such as shown in FIG. 6).

Although four separate embodiments of the invention have now been described in relation to FIGS. 4, 6, 8 and 9, it will be appreciated that there are many further possibilities. These will depend, amongst other things, on the particular nature and layout of components within a cavity (including their heat output and cooling requirements), the shape and dimensions of the cavity, the type of fan to be used, the form of ducting, and so on.

For example, the configuration of FIG. 8 could be modified so that fan 220 is replaced by a centrifugal fan positioned directly over the CPU 210. In this case the CPU would receive a relatively strong cooling airflow from the air that is sucked up into the axial intake of the van. Another possibility for FIG. 8 is that the locations of the fan 220 and the CPU 210 could be reversed. The CPU would then be positioned on the output side of fan 220 (in ducting 225), which as mentioned above can have certain advantages as regards fan efficiency. Note that a similar configuration could be obtained from FIG. 4, by replacing centrifugal fan 220 by an axial fan with its air intake facing rear wall 203. Such a layout would draw air in through front wall 201 and over the components within the blade, through to the fan intake at the rear of the cavity. The fan 220 would then direct an airflow into ducting 225 and over CPU 210, with the ducting subsequently guiding the airflow to exit through the rear wall 203 of the blade.

There is also considerable flexibility as regards the routing of the ducting to the vent facility. Thus a path can be selected through the three-dimensional volume of the blade to fit around the various computing components therein. In addition, the airflow in the ducting may also be utilised to cool one or more components other than or in addition to the CPU 210. For example, in FIG. 8 the ducting may pass over component B (i.e. be completely separate from it), particularly if the cooling requirements of component B are relatively modest. On the other hand, if component B is a relatively strong heat source, then the ducting may be formed to accommodate component B, such as by dropping to the floor of the blade, in the same manner as shown in FIG. 5 to encompass CPU 210. There is of course similar flexibility in the route and use of any internal ducting (such as shown in FIG. 9).

It will also be understood that although the various embodiments disclosed herein use just a single fan within a computer cavity, it is possible that one or more additional fans may be utilised in appropriate circumstances, for example if there are multiple distributed components that have special cooling requirements. Nevertheless, the approach described herein will still help to minimise the overall number of fans needed in any given situation.

Furthermore, there may possibly be shared fan facilities provided in the shelf 101 or rack 100 into which blade 200 is mounted (typically at the rear), to enhance general airflow through the set of blades stored within the system. Note that if each individual blade is capable of generating its own adequate cooling airflow, then the need for such additional shared fans can be avoided. However, the extent to which this is possible is dependent amongst other things on the nature and configuration of any other shared equipment within the shelf or rack. Thus such equipment may act as something of an obstruction to airflow through the blades, whereby additional shared fans are employed to compensate for this.

It will also be appreciated that although the invention has been described in relation to a blade unit for rack-mounted server system, it is also applicable to a wide range of computer systems having a single cavity. Such systems include for example a conventional personal computer, a computer workstation, or a network computer/terminal/thin client, which can all be potentially cooled in the manner disclosed herein.

In conclusion, a variety of particular embodiments have been described in detail, but it will be appreciated that this is by way of exemplification only. The skilled person will be aware of many further potential modifications and adaptations that fall within the scope of the claimed invention and its equivalents. Moreover, while the claims specifically recite certain combinations of features, it will be apparent to the skilled person that many other embodiments involving different combinations of such features may also be of benefit.

What is claimed is:

1. Computing apparatus including:
   a housing that defines a cavity;
   multiple computing components within the cavity;
   a fan within the cavity for cooling the computing components, the fan having an air inlet and an air outlet within the cavity such that air flows from the air inlet through the fan to the air outlet;
   a vent facility in a first wall of the housing, wherein the vent facility comprises one or more openings to an exterior of the housing to allow air flow between the exterior of the housing and an interior of the housing; and
   ducting extending between the vent facility and one of the air inlet and the air outlet to define an enclosed path within the cavity between the fan and the vent facility, wherein the other of the air inlet and air outlet is located adjacent the first wall;
   wherein the fan comprises a centrifugal fan;
   wherein the enclosed path between the fan and the vent facility in the first wall starts from the fan in a general direction away from the first wall, and then is guided back by the ducting to the first wall.

2. The apparatus of claim 1, wherein the vent facility is the only vent facility in the first wall.

3. The apparatus of claim 1, further including a second vent facility in a second wall of the housing that communicates with the cavity, wherein the second wall is opposite the first wall.

4. The apparatus of claim 3, wherein the first wall is a rear wall of the apparatus, the second wall is a front wall of the apparatus, and the cooling airflow is generally in the direction from the front to the rear of the apparatus.

5. The apparatus of claim 4, wherein the ducting extends between the air outlet and the vent facility, thereby directing an air outflow to the rear of the apparatus.

6. The apparatus of claim 3, wherein the first wall is a front wall of the apparatus, the second wall is a rear wall of the apparatus, and the cooling airflow is generally in a direction from the front to the rear of the apparatus.

7. The apparatus of claim 6, wherein the ducting extends between the air inlet and the vent facility, thereby drawing an air inflow from the front of the apparatus.

8. The apparatus of claim 1, wherein a computing component which is a primary heat source within the cavity is positioned in the enclosed path.

9. The apparatus of claim 8, wherein the computing component which is the primary heat source is a central processing unit (CPU).

10. The apparatus of claim 9, wherein the CPU is attached to a heat sink which is positioned in the enclosed path.

11. The apparatus of claim 9, wherein the fan is geometrically located between the CPU and the first wall.

12. The apparatus of claim 1, wherein the cavity is generally cuboid in form, and the dimension perpendicular to the first wall represents the longest dimension of the cavity.

13. The apparatus of claim 12, wherein the longest dimension is from the front to the back of the apparatus, and the cooling airflow travels generally from the front to the back of the apparatus.

14. The apparatus of claim 1, wherein the fan comprises a centrifugal fan.

15. The apparatus of claim 1, wherein the fan comprises the sole fan within the cavity.

16. The apparatus of claim 1, wherein the computing components are generally attached to a card adjacent to or forming a third wall of the housing perpendicular to the first wall, and wherein the ducting is attached or adjacent to a fourth wall of the housing opposite the third wall.

17. The apparatus of claim 1, wherein the enclosed path between the fan and the vent facility in the first wall starts from the fan in a general direction away from the first wall, and then is guided back by the ducting to the first wall.

18. The apparatus of claim 1, wherein the other of the air inlet and air outlet that is located adjacent the first wall communicates with the cavity via an internal duct.

19. The apparatus of claim 1, wherein the apparatus comprises the system unit of a personal computer.

20. The apparatus of claim 1, wherein the apparatus comprises a blade for use in a rack-mounted computing system.

21. Computing apparatus including:
   a housing that defines a cavity;
   multiple computing components within the cavity;
   a fan within the cavity for generating a cooling airflow for the computing components, the fan having an air inlet and an air outlet within the cavity such that air flows from the air inlet through the fan to the air outlet;
   a first vent facility in a rear wall of the housing;
   ducting extending between the first vent facility and the air outlet to define an enclosed path within the cavity between the fan and the first vent facility, wherein the air inlet is located adjacent the rear wall;
   and a second vent facility in a front wall of the housing that communicates with the cavity, whereby the cooling airflow is generally in the direction from the front to the rear of the apparatus;

wherein the fan comprises a centrifugal fan;
wherein the enclosed path between the fan and the first vent facility in the first wall starts from the fan in a general direction away from the first wall, and then is guided back by the ducting to the first wall.

22. The computing apparatus of claim 21, further comprising a CPU positioned within the enclosed path.

23. A blade for use in a rack-mounted server, the blade including:
a housing that defines a cavity;
multiple computing components within the cavity;
a fan within the cavity for generating a cooling airflow for the computing components, the fan having an air inlet and an air outlet within the cavity such that air flows from the air inlet through the fan to the air outlet;
a first vent facility in a rear wall of the housing;
ducting extending between the first vent facility and the air outlet to define an enclosed path within the cavity between the fan and the first vent facility past a CPU included within the blade, wherein the air inlet is located adjacent the rear wall;
and a second vent facility in a front wall of the housing that communicates with the cavity, whereby the cooling airflow is generally in the direction from the front to the rear of the blade;
wherein the fan comprises a centrifugal fan;
wherein the enclosed path between the fan and the first vent facility in the first wall starts from the fan in a general direction away from the first wall, and then is guided back by the ducting to the first wall.

24. A method for cooling computing apparatus, the computer apparatus including a housing that defines a cavity and multiple computing components within the cavity, and a vent facility in a first wall of the housing, wherein the vent facility comprises one or more openings to an exterior of the housing to allow air flow between the exterior of the housing and an interior of the housing, the method comprising:
generating with a fan within the cavity an airflow to cool the computing components, the fan having an air inlet and an air outlet within the cavity such that air flows from the air inlet through the fan to the air outlet; and
defining an enclosed path within the cavity between the fan and the vent facility by providing ducting extending between the vent facility and one of the air inlet and the air outlet, wherein the other of the air inlet and air outlet is located adjacent the first wall;
wherein the fan comprises a centrifugal fan;
wherein the enclosed path between the fan and the vent facility in the first wall starts from the fan in a general direction away from the first wall, and then is guided back by the ducting to the first wall.

25. The method of claim 24, wherein the vent facility is the only vent facility in the first wall.

26. The method of claim 24, further including providing a second vent facility in a second wall of the housing that communicates with the cavity, wherein the second wall is opposite the first wall.

27. The method of claim 26, wherein the first wall is a rear wall of the apparatus, the second wall is a front wall of the apparatus, and the cooling airflow is generally in the direction from the front to the rear of the apparatus.

28. The method of claim 27, wherein the ducting extends between the air outlet and the vent facility, thereby directing an air outflow to the rear of the apparatus.

29. The method of claim 26, wherein the first wall is a front wall of the apparatus, the second wall is a rear wall of the apparatus, and the cooling airflow is generally in the direction from the front to the rear of the apparatus.

30. The method of claim 29, wherein the ducting extends between the air inlet and the vent facility, thereby drawing an air inflow from the front of the apparatus.

31. The method of claim 24, wherein a computing component which is a primary heat source within the cavity is positioned in the enclosed path.

32. The method of claim 31, wherein the computing component which is the primary heat source is a central processing unit (CPU).

33. The method of claim 32, wherein the CPU is attached to a heat sink which is positioned in the enclosed path.

34. The method of claim 33, wherein the fan is geometrically located between the CPU and the first wall.

35. The method of claim 24, wherein the cavity is generally cuboid in form, and a dimension perpendicular to the first wall represents a longest dimension of the cavity.

36. The method of claim 35, wherein the longest dimension is from the front to the rear of the apparatus, and the cooling airflow travels generally from the front to the rear of the apparatus.

37. The method of claim 24, wherein the fan comprises the sole fan within the cavity.

38. The method of claim 24, wherein the computing components are generally attached to a card adjacent to or forming a third wall of the housing perpendicular to the first wall, and wherein the ducting is attached or adjacent to a fourth wall of the housing opposite the third wall.

39. The method of claim 24, wherein the other of the air inlet and air outlet that is located adjacent the first wall communicates with the cavity via an internal duct.

40. The method of claim 24, wherein the computing apparatus comprises the system unit of a personal computer.

41. The method of claim 24, wherein the computing apparatus comprises a blade for use in a rack-mounted computing system.

42. A computing apparatus, comprising:
a housing that defines a cavity, wherein the housing comprises a vent facility in a first wall of the housing, wherein the vent facility comprises one or more openings to an exterior of the housing to allow air flow between the exterior of the housing and an interior of the housing;
a plurality of computing components;
a fan for generating an airflow to cool the plurality of computing components wherein the plurality of computing components and the fan are located within the cavity; and
wherein the fan includes a first path defining an air inflow and a second path defining an air outflow, wherein one of the first path and second paths is ducted to the vent facility in the first wall of the housing, and the other one of the first path and second paths communicates with the cavity, wherein the one of the first path and second paths that is ducted to the vent facility in the first wall starts from the fan in a general direction away from the first wall, and then is guided back by ducting to the first wall.

43. A method of cooling a computing apparatus, comprising:
generating an airflow with a fan to cool the computing apparatus, wherein the airflow comprises a first path of air inflow, and a second path of air outflow;

ducting one of the first path and second paths to a vent facility in a first wall of a housing; wherein the vent facility comprises one or more openings to an exterior of the housing to allow air flow between the exterior of the housing and an interior of the housing, wherein the other one of the first and second paths communicates with the cavity, wherein the one of the first and second paths that is ducted to the vent facility in the first wall starts from the fan in a general direction away from the first wall, and then is guided back by ducting to the first wall; and wherein the housing includes a cavity, and wherein the cavity includes multiple computing components of the computing apparatus.

* * * * *